United States Patent
Ren et al.

(10) Patent No.: US 8,753,948 B2
(45) Date of Patent: Jun. 17, 2014

(54) METHODS OF FORMING LATERALLY DIFFUSED METAL OXIDE SEMICONDUCTOR TRANSISTORS FOR RADIO FREQUENCY POWER AMPLIFIERS

(75) Inventors: Xiaowei Ren, Phoenix, AZ (US); Robert P. Davidson, Chandler, AZ (US); Mark A. Detar, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 73 days.

(21) Appl. No.: 13/285,557

(22) Filed: Oct. 31, 2011

(65) Prior Publication Data
US 2013/0105892 A1   May 2, 2013

(51) Int. Cl.
*H01L 21/331*   (2006.01)

(52) U.S. Cl.
USPC .............. 438/373; 438/375; 257/E21.057; 257/336

(58) Field of Classification Search
USPC ............. 438/373, 375; 257/E21.057, 336
See application file for complete search history.

(56) References Cited

U.S. PATENT DOCUMENTS

| | | | |
|---|---|---|---|
| 4,173,818 A * | 11/1979 | Bassous et al. | 438/286 |
| 7,927,939 B2 | 4/2011 | Pearce | |
| 2004/0262680 A1 | 12/2004 | Ehwald et al. | |

OTHER PUBLICATIONS

Burger, W.R., Recent Advances in RF-LDMOS High-Power IC Development, IEEE, 2009.
Freescale Semiconductor, Inc., 50V RF LDMOS; An ideal RF power technology for ISM, boradcast and commercial aerospace applications, White Paper, 13 pgs., Jun. 2011.

* cited by examiner

*Primary Examiner* — Amar Movva
(74) *Attorney, Agent, or Firm* — Daniel D. Hill

(57) ABSTRACT

A lateral diffused metal oxide semiconductor (LDMOS) transistor is provided. The LDMOS transistor includes a substrate having a source region, channel region, and a drain region. A first implant is formed to a first depth in the substrate. A gate electrode is formed over the channel region in the substrate between the source region and the drain region. A second implant is formed in the source region of the substrate; the second implant is laterally diffused under the gate electrode a predetermined distance. A third implant is formed to a second depth in the drain region of the substrate; the second depth is less than the first depth. A method for forming the LDMOS transistor is also provided.

20 Claims, 3 Drawing Sheets ating metal oxide semiconductor transistors for radio frequency power amplifiers

BACKGROUND

1. Field

This disclosure relates generally to transistors, and more specifically, to a laterally diffused metal oxide semiconductor (LDMOS) transistor for a radio frequency power amplifier and method therefor.

2. Related Art

Laterally diffused metal oxide semiconductor (LDMOS) transistors are used in high power analog circuits. One application for LDMOS transistors is in radio frequency (RF) power amplifiers. Optimization characteristics such as power density and linearity often conflict. That is, it may be difficult to have good power density without compromising linearity. Conversely, it may be difficult to have good linearity without compromising power density and/or gain. Also, there are other trade-offs that can be important.

A conventional RF LDMOS transistor is constructed on a relatively thin P-type epitaxial silicon layer over a highly doped P-type silicon substrate. In addition to a standard MOSFET structure, one common LDMOS transistor structure includes a laterally diffused P-well, a sinker, and a lightly doped drain region. The lightly doped drain is formed by implanting an N-type doping through a screen oxide in the selected region after forming a gate electrode. A doping level of the lightly doped drain has a large impact on power density, efficiency, and hot carrier injection (HCI) reliability. A common way to improve power density is to increase the doping level of the lightly doped drain. However, a consequence of increased drain doping is an undesirable increase in the peak electric-field in the drain region that reduces HCI reliability, thus limiting the increased power density.

Another LDMOS transistor structure is the same as the above described structure except that the lightly doped drain region extends beyond an edge of the gate electrode and into the channel region underneath the gate electrode. The extended lightly doped drain is formed prior to gate electrode formation by diffusing an N-type layer across the silicon surface. This structure also improves power density; however, the increased power density causes a substantial degradation in linearity. In both of the above described LDMOS structures, improving power density can be difficult without compromising other performance related characteristics, such as linearity, efficiency, and HCI reliability.

Therefore, what is needed is an LDMOS transistor that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
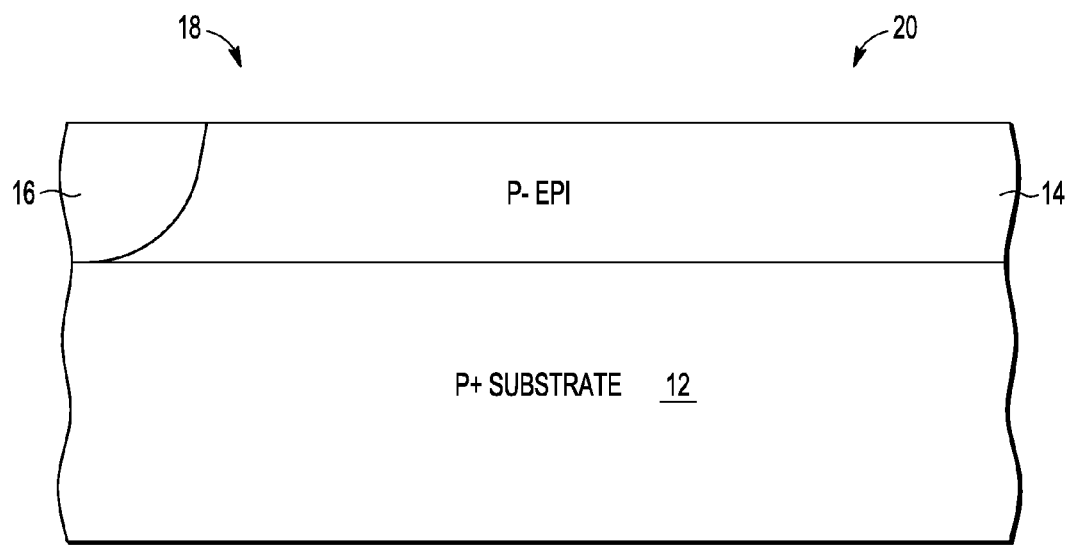
FIGS. 1-6 illustrate cross-sectional views of an LDMOS transistor during different stages of manufacture in accordance with an embodiment.

Generally, there is provided, an LDMOS transistor with a first lightly doped drain region that extends into channel region under the gate. The first lightly doped drain is formed by implanting an N-type dopant into a surface of the entire transistor region prior to the gate formation. The LDMOS transistor includes a second shallower lightly doped N-type region formed in the drain in combination with the first lightly doped N-type region. The second shallower N-type region is implanted from an edge of the gate electrode to a lightly doped N-type drain region. The addition of the second shallower and lighter N-type implant results in a shallow drain region with a higher net N-type dopant concentration creating a vertical double drain doping profile. The extended drain (first lightly doped drain) provides good power density. The first lightly doped drain has a lower N-type dopant concentration than is normally used; therefore the linearity can be improved. With the second shallower N-type implant in the drain region, the total dopant concentration can be higher than in a transistor having only a single N-type implant; thus providing improved power density over the single N-type implant.

The vertical double drain doping profile provides greater latitude for electric field optimization so that a reduced electric field at the gate oxide interface can be achieved with an even higher total N-type doping density in the drain region. The second shallower N-type implant provides additional control over the amount of dopant that diffuses into the channel region, which in turn allows better control of linearity. Also, the second shallower N-type implant provides protection against power density degradation by compensating for the amount of P-type dopant that diffuses into the drain. The higher total N-type dopant concentration achieved with the vertical double drain dopant profile lowers drain resistance and therefore improves power density and efficiency. Vertical double drain dopant profile also improves the electric field distribution and provides better current sinking ability which is important for ruggedness. In RF LDMOS transistors, hot carrier injection (HCI) into the oxide above the lightly doped drain can alter the drain-source resistance ($R_{DSON}$). The lower dose of the second shallower N-type implant through a screen oxide reduces damage in the screen oxide and therefore reduces drift in $R_{DSON}$.

In one aspect, there is provided, a method for forming a lateral diffused metal oxide semiconductor (LDMOS) transistor, the method comprising: providing a substrate having a first surface and a second surface, wherein the first surface comprises an epitaxial layer, and wherein the first surface comprises a drain region, a source region, and a channel region for the LDMOS transistor; implanting a first dopant of a first type having a first doping concentration in the first surface of the substrate, wherein the first dopant is implanted to a first depth, and wherein the first dopant is implanted in both the source region, the drain region, and the channel region; forming a gate electrode over the channel region of the first surface of the substrate; selectively implanting a second dopant of a second type in the source region of the first surface, the second dopant having a second doping concentration, wherein the second dopant laterally diffusing under the gate electrode a predetermined distance, and wherein the second type is different than the first type; selectively implanting a third dopant of the first type in the drain region of the first surface, the third dopant having a third doping concentration, wherein the third dopant is implanted to a second depth, the second depth being less than the first depth; forming a source implant in the source region; and forming a drain implant in the drain region. The method may further comprise forming a sinker implant in the source region, wherein the sinker implant is used to provide a connection from the source region to the second surface of the substrate.

The first type may be an N-type dopant and the second type may be a P-type dopant. The gate electrode may be formed from polysilicon. The epitaxial layer may be lightly doped relative to a doping concentration of the substrate. The step of selectively implanting the second dopant may further comprise laterally diffusing the second dopant for substantially an entire length of the gate electrode. The step of forming the source implant and forming the drain implant may comprise forming an N+ source implant and forming an N+ drain implant. The step of selectively implanting the third dopant may further comprise implanting the third dopant with no lateral diffusion under the gate electrode. The first dopant may be implanted before the gate electrode is formed. A net doping concentration of the drain region may be greater than either of the first doping concentration or the third doping concentration.

In another aspect, there is provided, a method for forming a lateral diffused metal oxide semiconductor (LDMOS) transistor, the method comprising: providing a substrate having a first surface and a second surface, wherein the first surface comprises an epitaxial layer, and wherein the first surface comprises a drain region, a source region, and a channel region for the LDMOS transistor; implanting a first N-type dopant having a first doping concentration in the first surface of the substrate, wherein the first N-type dopant is implanted to a first depth, and wherein the first N-type dopant is implanted in the source region, the channel region, and the drain region; forming a gate electrode over the first surface of the substrate; selectively implanting a P-type dopant in the source region of the first surface, the P-type dopant having a second doping concentration, wherein the P-type dopant laterally diffusing under the gate electrode into the channel region a predetermined distance; selectively implanting a second N-type dopant in the drain region of the first surface, the second N-type dopant having a third doping concentration, wherein the second N-type dopant is implanted to a second depth, the second depth being less than the first depth; forming an N+ source implant in the source region; and forming an N+ drain implant in the drain region. The method may further comprise forming a sinker implant in the source region, wherein the sinker implant is used to provide a connection from the source region to the second surface of the substrate. The gate electrode may be formed from polysilicon. The epitaxial layer may be lightly doped relative to a doping concentration of the substrate. The step of selectively implanting the second dopant may further comprise laterally diffusing the second dopant for substantially an entire length of the gate electrode. The step of selectively implanting the third dopant may further comprise implanting the third dopant with minimal lateral diffusion under the gate electrode.

In yet another aspect, there is provided, a lateral diffused metal oxide semiconductor (LDMOS) transistor comprising: a substrate having a source region, a drain region, and a channel region; a first implant formed to a first depth in the substrate; a gate electrode formed over the channel region; a second implant formed in the source region of the substrate, the second implant laterally diffused under the gate electrode into the channel region a predetermined distance; and a third implant formed to a second depth in the drain region of the substrate, the second depth being less than the first depth. The LDMOS transistor may further comprise: an N+ source implant in the source region a first predetermined distance from the gate electrode; and an N+ drain implant in the drain region a second predetermined distance from the gate electrode, wherein the third implant is formed from an edge of the gate electrode to the N+ drain implant. The second implant may be laterally diffused under the gate electrode in the channel region for substantially an entire length of the gate electrode. The first implant and the third implant may each comprise an N-type dopant, and the second implant may comprise a P-type dopant.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

FIGS. 1-6 illustrate cross-sectional views of LDMOS transistor 10 during different stages of manufacture in accordance with an embodiment.

FIG. 1 illustrates a cross-sectional view of P+ type silicon substrate 12. P+ type silicon substrate 12 is heavily doped. A relatively more lightly doped silicon epitaxial layer 14 is formed on a top surface of substrate 12. In one embodiment, epitaxial layer 14 is about 10 microns thick and comprises a P− type dopant. In another embodiment, the thickness and dopant type may be different. A P+ type sinker 16 is formed in epitaxial layer 14. In the illustrated embodiment, P+ sinker 16 will be connected to an N+ source electrode of LDMOS transistor 10 and is used to allow a backside electrical connection of the N+ source electrode through the highly conductive P+ substrate 12 to backside metal 13 (see FIG. 6). Connecting the source electrode to backside metal lowers the source inductance and provides additional advantages such as allowing the semiconductor die comprising transistor 10 to be directly attached to a thermally conductive package for cooling transistor 10. Substrate 12 includes a designated source region 18 and a drain region 20 for LDMOS transistor 10.

Figure 2:
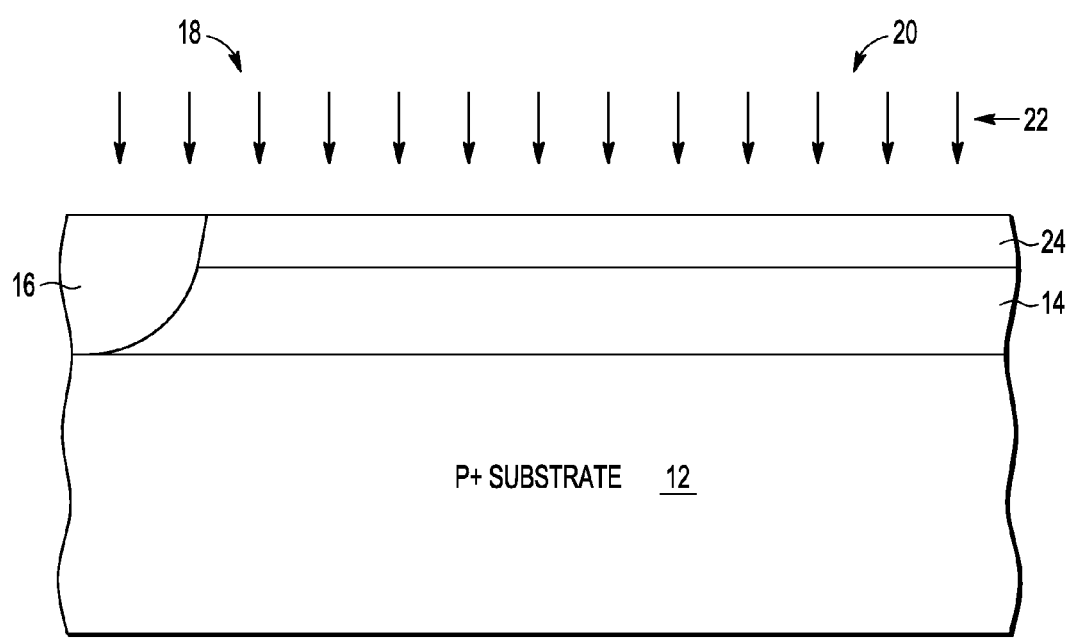

FIG. 2 illustrates a cross-sectional view of LDMOS transistor 10 after lightly doped N-type diffusion drift region 24 is implanted in epitaxial layer 14 using a relatively low doping concentration of, for example, arsenic in a first drain implantation step 22. Note that in other embodiments, a different N-type dopant besides arsenic can be used, such as for example, phosphorus. The first drain implantation step 22 provides a doping concentration of between about $1.0\,e^{12}$ to about $4.0\,e^{12}$ in one embodiment. In another embodiment, the doping range may be different. Diffused region 24 is implanted to a predetermined depth across both source region 18 and drain region 20. In one embodiment, the diffused region 24 is formed to a depth of about 0.2 to 0.5 microns. In another embodiment, the diffused region 24 depth may be different.

Figure 3:
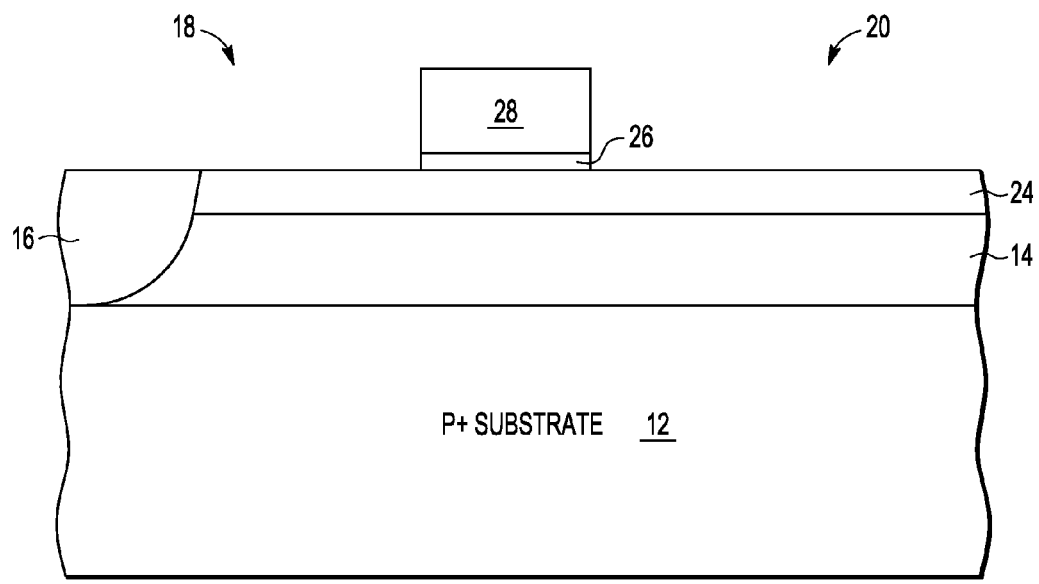

FIG. 3 illustrates a cross-sectional view of LDMOS transistor 10 after a gate electrode 28 is formed. A gate dielectric layer 26 is first deposited or grown on the top surface of silicon epitaxial layer 14. Gate dielectric layer 26 is silicon dioxide in one embodiment. In another embodiment, the material for gate dielectric 26 may be different. A gate electrode layer is formed on gate dielectric layer 26. In the illustrated embodiment, the gate electrode layer is formed from a deposited layer of polysilicon. In another embodiment, the gate material may be different, for example, the gate may be formed using a metal. The gate dielectric and the polysilicon layer are then patterned using a conventional masking and etching process to form gate electrode 28.

Figure 4:
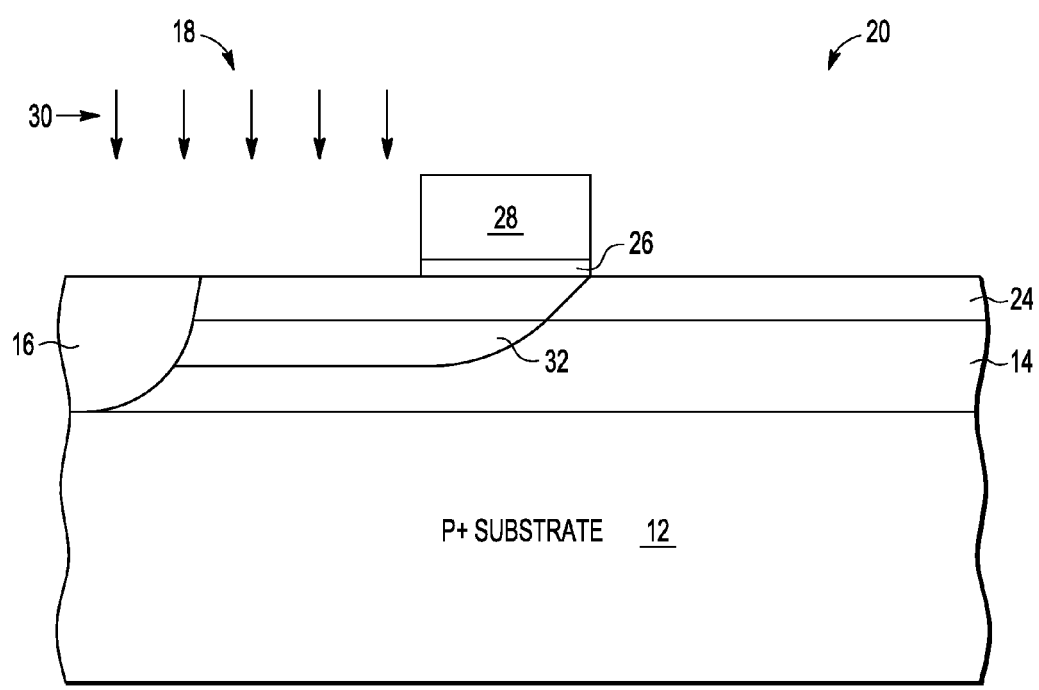

FIG. 4 illustrates a cross-sectional view of LDMOS transistor 10 after doped P-type diffusion region 32 is selectively implanted in only source region 18 using an implantation step 30. In one embodiment, boron is used in implantation step 30. A masking layer (not shown) may be used to prevent drain region 20 from being exposed to the P-type dopant during implantation step 30. A high temperature anneal may be used to cause the P-type dopant to diffuse under gate electrode 28 a predetermined distance into the channel region. The predetermined distance is determined by the implant conditions and subsequent thermal annealing process of implantation step 30. In one embodiment, the predetermined distance is a significant portion of the channel region under gate electrode 28 as illustrated in FIG. 4. In another embodiment, the predetermined distance is substantially an entire length of the channel region under gate electrode 28.

Figure 5:
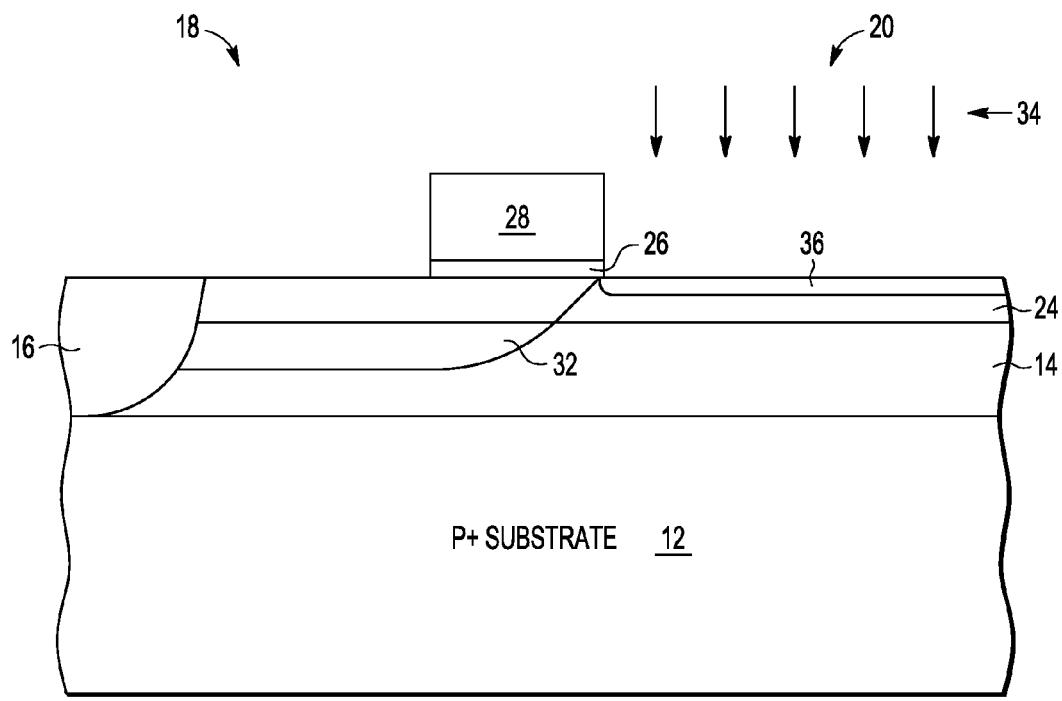

FIG. 5 illustrates a cross-sectional view of LDMOS transistor 10 after a second lightly doped relatively shallow N-type diffusion region 36 is selectively formed in drain region 20 only using a relatively low doping concentration of an N-type dopant in a second N-type drain implantation step 34. In one embodiment, arsenic is used as the dopant in implantation step 34. The second N-type implantation step provides a doping concentration in range of about $5.0\,e^{11}$-$5.0\,e^{12}$. In another embodiment, the doping range may be different. The second implantation step 34 in combination with the first implantation step 22 causes a net dopant concentration in drain region 20 to be higher than either the first implantation step 22 or the second implantation step 34. N-type diffusion region 36 is relatively shallow compared to first N-type diffusion region 24 and is formed to a depth of about 0.1-0.2 microns. In another embodiment, the depth of N-type diffusion region 36 may be different. In the illustrated embodiment, there is minimal or no lateral diffusion of N-type diffusion region 36 under gate electrode 28. N-type diffusion region 36 extends from an edge of gate electrode 28 across drain region 20.

Figure 6:
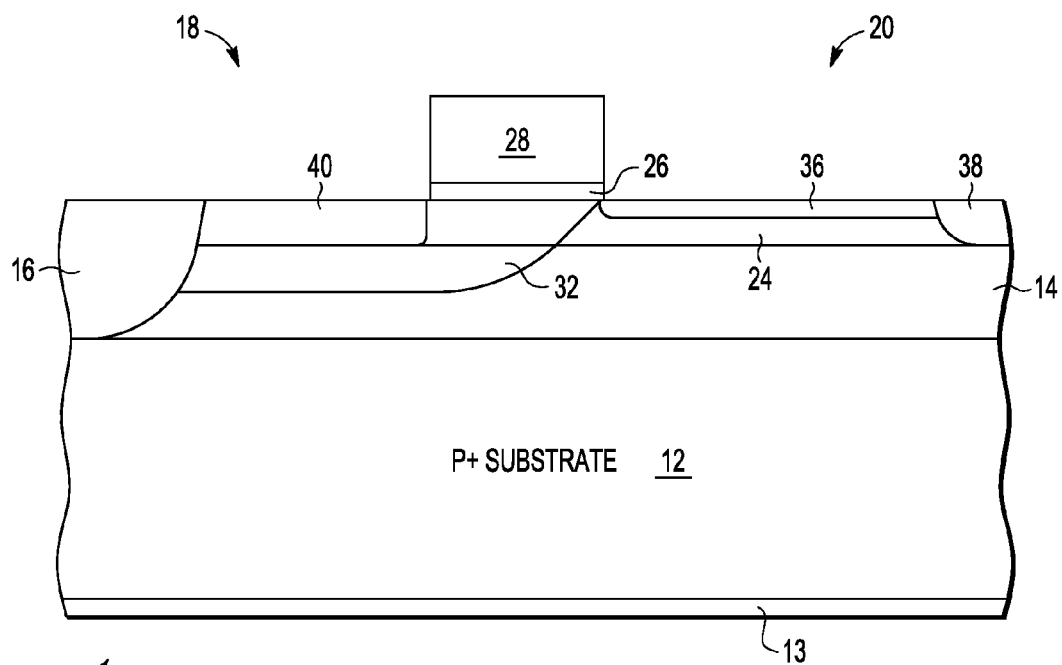

FIG. 6 illustrates a cross-sectional view of LDMOS transistor 10 after highly doped N+ source implant 40 is formed in source region 18 and highly doped N+ drain implant 38 is formed in drain region 20 using a conventional manufacturing process. A backside metal layer 13 is provided on the bottom surface, or backside, of substrate 12 to provide for an electrical connection to the substrate.

Persons of skill in the art will realize that further conventional processing steps that are not illustrated in the figures are performed to complete LDMOS transistor 10. For example, spacers may be formed on the sidewalls of gate electrode 28. The surface of silicon epitaxial layer 14 may be silicided and metal source, drain, and gate contacts are formed on the silicide. Additional metal and dielectric layers may be added as necessary. Also, note that only one gate electrode 28 of a high power LDMOS transistor is illustrated. Additional gate electrodes are typically included to provide a complete LDMOS transistor.

The two N-type implantation steps 22 and 34 create a vertical double doping profile in drain region 20. The first diffusion region portion 24 provides a more effective channel connection region between drain region 20 and source region 18, thus reducing the transistor on-resistance and improving power density. The shallow second N-type diffusion region portion 36 provides an additional amount of dopant in the drain region while controlling the amount of dopant that diffuses into the channel region under gate electrode 28. The additional dopant in the drain region reduces the drain resistance, thus improving power density and efficiency. The limited N-type dopant under the influence of the gate electrode provides greater control of linearity. Also, the shallow second N-type dopant 36 balances P-type dopant region 32 into the drain, and thus further controls power density. In addition, the second shallow N-type drain region 36 results in a higher total N-type dopant in drain region 20 that is higher than either one of the first and second N-type implantation dopant doses separately. The higher total dopant in drain region 20 lowers the drain resistance and improves power density and efficiency. Further, the combination of first and second N-type dopant implants 24 and 36 improves the electric-field distribution, lowers the peak electric field under the gate oxide, and thus better control of HCI effects. Also, the double vertical implant profiles in the drain improves the vertical electric field distribution and provides better current sinking ability which are both important for ruggedness. Also, the second N-type implant through a screen oxide (not shown) with a lower dose than a single N-type implant reduces damage in the screen oxide and therefore, reduces the HCI induced on-resistance drift effect.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a lateral diffused metal oxide semiconductor (LDMOS) transistor, the method comprising:
   providing a substrate having a first surface and a second surface, wherein the first surface comprises an epitaxial layer, and wherein the first surface comprises a drain region, a source region, and a channel region for the LDMOS transistor;
   implanting a first dopant of a first type having a first doping concentration in the first surface of the substrate, wherein the first dopant is implanted to a first depth, and wherein the first dopant is implanted in the source region, the drain region, and the channel region;

forming a gate electrode over the channel region of the first surface of the substrate;

selectively implanting a second dopant of a second type in the source region of the first surface, the second dopant having a second doping concentration, wherein the second dopant laterally diffusing under the gate electrode a predetermined distance, and wherein the second type is different than the first type;

selectively implanting a third dopant of the first type in the drain region of the first surface, the third dopant having a third doping concentration, wherein the third dopant is implanted to a second depth, the second depth being less than the first depth;

forming a source implant in the source region; and forming a drain implant in the drain region.

2. The method of claim 1, further comprising forming a sinker implant in the source region, wherein the sinker implant is used to provide a connection from the source region to the second surface of the substrate.

3. The method of claim 1, wherein the first type is an N-type dopant and the second type is a P-type dopant.

4. The method of claim 1, wherein the gate electrode is formed from polysilicon.

5. The method of claim 1, wherein the epitaxial layer is lightly doped relative to a doping concentration of the substrate.

6. The method of claim 1, wherein selectively implanting the second dopant further comprises laterally diffusing the second dopant for substantially an entire length of the gate electrode.

7. The method of claim 1, wherein forming the source implant and forming the drain implant comprise forming an N+ source implant and forming an N+ drain implant.

8. The method of claim 1, wherein selectively implanting the third dopant further comprises implanting the third dopant with no lateral diffusion under the gate electrode.

9. The method of claim 1, wherein the first dopant is implanted before the gate electrode is formed.

10. The method of claim 1, wherein a net doping concentration of the drain region is greater than either of the first doping concentration or the third doping concentration.

11. A method for forming a lateral diffused metal oxide semiconductor (LDMOS) transistor, the method comprising:

providing a substrate having a first surface and a second surface, wherein the first surface comprises an epitaxial layer, and wherein the first surface comprises a drain region, a source region, and a channel region for the LDMOS transistor;

implanting a first N-type dopant having a first doping concentration in the first surface of the substrate, wherein the first N-type dopant is implanted to a first depth, and wherein the first N-type dopant is implanted in the source region, the channel region, and the drain region;

forming a gate electrode over the channel region of the first surface of the substrate;

selectively implanting a P-type dopant in the source region of the first surface, the P-type dopant having a second doping concentration, wherein the P-type dopant laterally diffusing under the gate electrode into the channel region a predetermined distance;

selectively implanting a second N-type dopant in the drain region of the first surface, the second N-type dopant having a third doping concentration, wherein the second N-type dopant is implanted to a second depth, the second depth being less than the first depth;

forming an N+ source implant in the source region; and forming an N+ drain implant in the drain region.

12. The method of claim 11, further comprising forming a sinker implant in the source region, wherein the sinker implant is used to provide a connection from the source region to the second surface of the substrate.

13. The method of claim 11, wherein the gate electrode is formed from polysilicon.

14. The method of claim 11, wherein the epitaxial layer is lightly doped relative to a doping concentration of the substrate.

15. The method of claim 11, wherein selectively implanting the second dopant further comprises laterally diffusing the second dopant for substantially an entire length of the gate electrode.

16. The method of claim 11, wherein selectively implanting the third dopant further comprises implanting the third dopant with minimal lateral diffusion under the gate electrode.

17. A method for forming a lateral diffused metal oxide semiconductor (LDMOS) transistor, the method comprising:

forming a first implant of a first type and a first doping density to a first depth in a substrate having a source region, a drain region, and a channel region, wherein the first implant is formed in at least the drain region and the channel region;

forming a gate electrode over the channel region;

after forming the gate electrode, forming a second implant of a second type that is different from the first type in the source region of the substrate, the second implant laterally diffused under the gate electrode into the channel region a predetermined distance, wherein the second implant overlaps a portion of the first implant within the channel region; and forming a third implant of the first type and a second doping density that is greater than the first doping density to a second depth in the drain region of the substrate, the second depth being less than the first depth.

18. The method of claim 17, further comprising:

forming an N+ source implant in the source region a first predetermined distance from the gate electrode; and forming an N+ drain implant in the drain region a second predetermined distance from the gate electrode, wherein the third implant is formed in the channel region from an edge of the gate electrode to the N+ drain implant.

19. The method of claim 17, wherein the second implant is laterally diffused under the gate electrode for substantially an entire length of the gate electrode.

20. The method of claim 17, wherein the first implant and the third implant each comprises an N-type dopant, and the second implant comprises a P-type dopant.

* * * * *